United States Patent
Holmlund et al.

(10) Patent No.: US 6,734,353 B2
(45) Date of Patent: May 11, 2004

(54) METHOD FOR ATTENUATING INTERFERENCE IN A MAGNETICALLY SHIELDED ROOM

(75) Inventors: Christer Holmlund, Kauniainen (FI); Heikki Seppä, Helsinki (FI); Auvo Penttinen, Helsinki (FI)

(73) Assignee: Valtion Teknillinen Tutkimuskeskus, Vtt (FI)

( * ) Notice: Subject to any disclaimer, the term of this patent is extended or adjusted under 35 U.S.C. 154(b) by 0 days.

(21) Appl. No.: 10/149,979
(22) PCT Filed: Dec. 12, 2000
(86) PCT No.: PCT/FI00/01086
§ 371 (c)(1), (2), (4) Date: Aug. 13, 2002
(87) PCT Pub. No.: WO01/45481
PCT Pub. Date: Jun. 21, 2001

(65) Prior Publication Data
US 2003/0121339 A1 Jul. 3, 2003

(30) Foreign Application Priority Data
Dec. 13, 1999 (FI) .............................. 19992674
Aug. 16, 2000 (FI) .............................. 20001820

(51) Int. Cl.$^7$ .............................................. H05K 9/00
(52) U.S. Cl. ............................ 174/35 R; 174/35 MS
(58) Field of Search .................... 174/35 R, 35 MS; 361/816, 818; 52/79.1, 262, 263, 265, 267, 268, 269, 272, 403.1, 480, 481.1

(56) References Cited

U.S. PATENT DOCUMENTS

| 4,914,350 A | | 4/1990 | Bosch et al. |
| 5,043,529 A | * | 8/1991 | Vanesky et al. ........ 174/35 MS |
| 6,282,848 B1 | * | 9/2001 | Schlapfer .................... 52/79.1 |

FOREIGN PATENT DOCUMENTS

| DE | 19718649 A1 | 11/1998 |
| SE | 503668 C2 | 10/1995 |
| WO | 9001861 A1 | 2/1990 |
| WO | 9426084 A1 | 11/1994 |

* cited by examiner

Primary Examiner—Dean A. Reichard
Assistant Examiner—Carmelo Oliva
(74) Attorney, Agent, or Firm—Birch, Stewart, Kolasch & Birch, LLP

(57) ABSTRACT

The invention relates to a method for attenuating magnetic interference in a test room (1, 2, 8, 9) equipped with a shield of ferromagnetic material, in which method the interfering magnetic field is measured and a compensating field is generated on the basis of the measurement result. According to the invention, the interfering field to be measured is resolved in three magnetic field components oriented in different directions, each one of said magnetic field components (x, y, z) is measured with the help of coils (3, 4, 5, 6) wound about the wall elements (1, 2, 8, 9) made from said ferromagnetic material in a manner wherein a flux component passing through at least one of the wall element (1, 2, 8, 9) made from said ferromagnetic material that is oriented parallel to one of said magnetic field components (x, y, z) is measured with the help of coils wound about said wall element.

12 Claims, 1 Drawing Sheet

METHOD FOR ATTENUATING INTERFERENCE IN A MAGNETICALLY SHIELDED ROOM

This application is the national phase under 35 U.S.C. § 371 of PCT International Application No. PCT/FI00/01086 which has an International filing data of Dec. 12, 2000, which designated the United States of America.

BACKGROUND OF THE INVENTION

Field of the Invention

The invention relates to a method for attenuating magnetic interference in a magnetically shielded room.

For high-sensitivity biomagnetic measurements, the test room must be shielded against external interference. As a starting point, it must be understood that the resolution of a modern Superconducting Quantum Interference Device (SQUID) magnetometer is in the order of 1 fT/Hz, while typical noise level of a laboratory room is $10^6$ fT at 1 Hz and almost $10^8$ fT at 0.01 Hz. Although gradiometers are conventionally used in measurements, it is necessary to attenuate the level of external interference fields. Generally, attenuation is accomplished with the help of two or a greater number of shields made from mu-metal. Also active means have been employed to improve the shield. Herein, the external magnetic field is measured outside the test room with the help of a flux-gate magnetometer, for instance, and then coils placed outside the test room have been used to improve the attenuation efficiency of the test room. Also a method has been described, wherein a Helmholtz coil placed outside the test room is used as both a magnetometer and a means for compensating for the detected field.

SUMMARY AND OBJECTS OF THE INVENTION

It is an object of the present invention to overcome the drawbacks of the abovedescribed techniques and to provide an entirely novel type of method for attenuating magnetic interference imposed on a magnetically shielded room.

The goal of the invention is achieved by way of arranging about the wall elements of a test room made from a ferromagnetic material a set of measurement coils by means of which the field causing interference can be determined. After the field of interference is known by its components, a compensating field of opposed magnitude can be established by means of compensating coils that adapted outside the test room.

The invention offers significant benefits.

The coil arrangement according to the invention makes it possible to measure the field of interference to a very high accuracy by virtue of making the shielded test room itself to act as the magnetometer. Then, the actual compensation may be carried out with the help of coils placed exterior to the test room.

A preferred embodiment of the invention also allows the field pattern to be resolved.

When necessary, even strong interference fields can be attenuated by feedback signals applied to multiturn compensating coils.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE PREFERRED EMBODIMENTS

Figure 1:
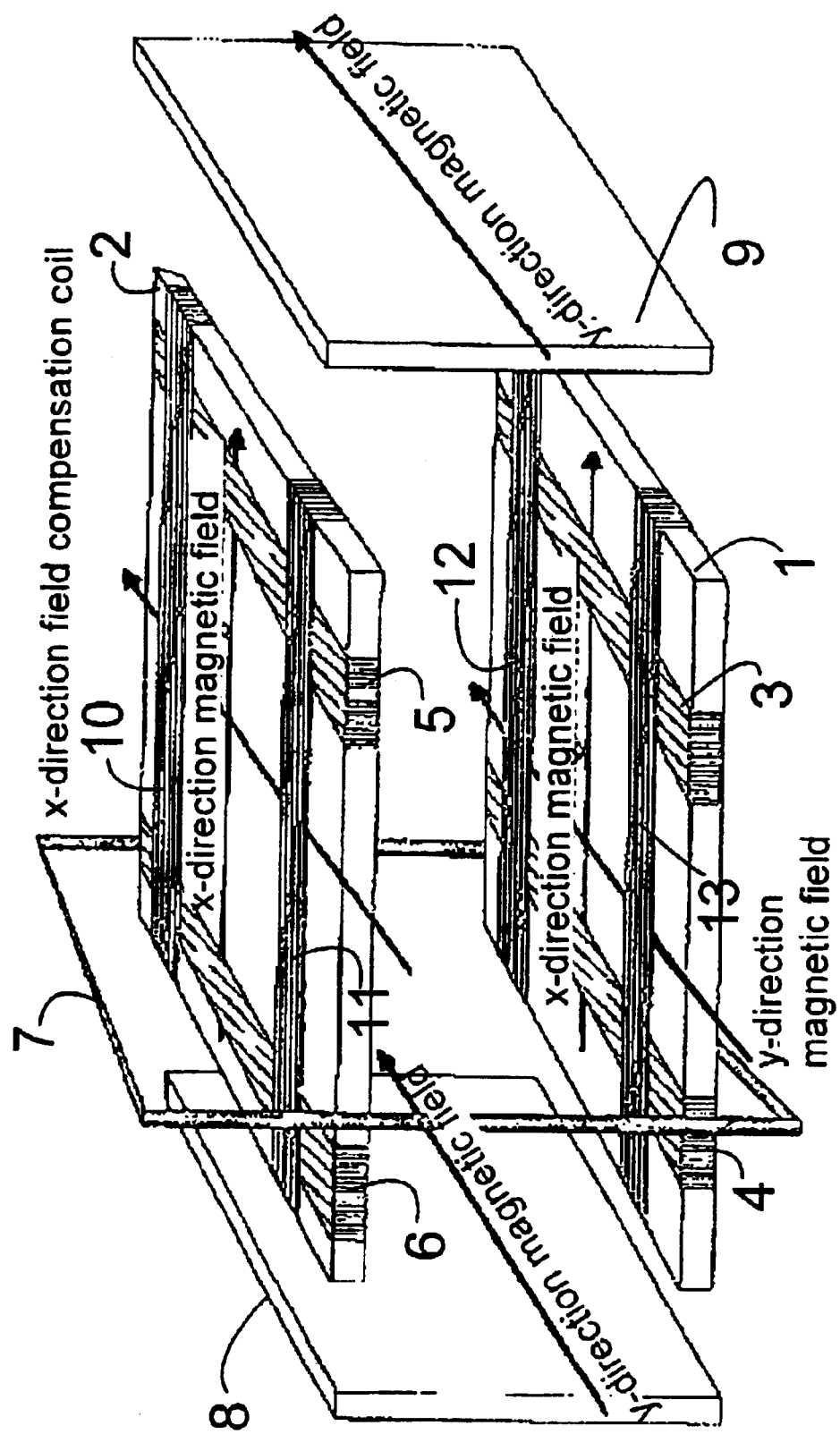
FIG. 1 shows a perspective view of an arrangement for attenuating an interference field.

Referring to the drawing, a case is assumed wherein the shielded room is comprised of two enclosingly superposed sheet walls made from mu-metal. The construction of the outer wall is illustrated in FIG. 1. For greater clarity of the illustration, two walls of the room, namely the front and the rear wall thereof, are omitted. The external source of interference imposes a magnetic field on the outer wall formed by the bottom and ceiling wall elements 1, 2 and the side wall elements 8 and 9, as well as the front and rear walls not shown in the drawing. If a multiturn coil is wound about the planar wall element 1 or 2, the magnetic field flux circulating in the wall induces a voltage in the coil. Through a series connections of the coils measuring the same vector component of the magnetic field imposed on the parallel-oriented wall elements 1 and 2, a measurement signal is obtained that is proportional to the magnitude of the selected vector component of the imposed field. Accordingly, a single wall 1 can be provided with four coils 5, 6 and 10, 11, respectively at each end of the wall, that measure the magnetic field in two different directions. In the embodiment shown in the drawing, coils 5 and 6 are arranged to measure the field strength in the x-direction, while coils 10 and 11 measure the field strength in the y direction. Thus, e.g. the x-direction field component can be measured using coils mounted on four wall elements in total, that is, using coils 3, 4, 5 and 6 and, additionally, using the other set of four coils of the not shown walls that are located substantially in the plane of the drawing. By way of using the same technique for measuring all the three vector components (directed along axes x, y and z) of the magnetic field, it is possible to obtain information on the nature of the external field "entering" the test room. Conversely, by applying a feedback voltage in opposite phase to the voltage induced in the coils that are located outside the test room, whereby coil 7, for instance, can act as the compensation coil of the x-direction field a component, a significant reduction can be obtained in the magnitude of the external field reaching the interior of the test room. Complementary to coil 7, the system also has compensation coils for the y- and z-direction field components. In the design of a compensator, it is must obviously be recognized that the induced voltage is proportional of the time derivative of the varying magnetic field.

It is possible to implement the concept of the invention having basically only one multiturn coil wound about one wall element per each vector direction x, y and z of the magnetic field. However, using two coils 5 and 6 wound about one wall element 2 as shown in the drawing, it is possible either to obtain a stronger signal from a series connection of the coils or, alternatively, to assess the gradient of the magnetic field between the ends of the wall 2 by way of measuring the voltages induced in the coils 5 and 6 independently. The same strategy may also be applied between the opposite walls 1 and 2 by way of using their coils either for getting a stronger overall measurement signal or, alternatively, for determination of the field distribution between top and bottom or front and back wall of the "tubular" space element. Typically, the measurement signal is maximized by arranging the sensing of the interference field to take place with the help of a tube formed by four walls and having its axis aligned parallel to the field being measured, whereby each wall element has one or more coils wound about the wall element and all the coils being connected in series with each other so that voltages induced in the coils augment each other thus giving a measurement signal proportional to the overall flux of the interference field passing through the wall. The same arrangement can be applied to all the three field components which means that in the case illustrated in the drawing, the x-component of the magnetic field is measured with the help of the tubular space element perpendicular to the magnetic field, the y-component with the help of the longitudinal tubular space element (drawn in a disposition perpendicular to the plane of the diagram) and the z-component with the help of the vertically aligned tubular space element. To eliminate measurement errors, it is even possible to the measure the flux at the ends of the "tubular" space elements with the help of separate coils.

Man-made magnetic field interference increases toward lower frequencies at a rate of about 20 dB decade. At very low frequencies or in a low-interference environment, the external interference is caused by geomagnetic fields. These are characterized in that the interference level increases toward low end of the frequency spectrum at a rate of 30 dB/decade. In addition to these, the 50 Hz main frequency and its harmonics act as a significant source of interference in biomagnetic measurements. It must be borne in mind that the voltage signal in inductively coupled phenomena is proportional to the frequency of the field. At high frequencies, the noise level is generally determined by the thermal noise of the loss components of an antenna, but at low frequencies the noise signal arises from the so-called 1/f noise of the amplifier. More specifically, the signal-to-noise ratio of an antenna integrated with the magnetic shield of a test room falls at a rate of 20 dB decade over the frequency range of about 0.1 Hz to 1 kHz, while toward the very low frequencies (of about 0.001 Hz to 0.1 Hz) the rate is about 30 dB decade. This means that the voltage resolution of a multiturn coil integrated in the wall of the test room exceeds over a wide frequency range (0.001 Hz to 1 kHz) the level of voltage induced by an external interference field on a wall. Hence, an active shielding arrangement based on induction coils mounted on the walls of a test room can reduce in a crucial manner the magnetic field penetrating into the test room.

The implementation of the present method requires for the elimination of the different components of the interfering magnetic field the use of coils mounted outside the test room in same manner as compensation coil 7 in FIG. 1. Typically, the system uses a 50 Hz oscillator which is synchronized to the main frequency, and wherefrom, 100 Hz and 150 Hz harmonic signals are generated, whereby the interference level of the test room is reduced through applying all these signals in proper phase to the compensation coils 7. Antennas mounted on the test room walls can be utilized for measuring the interference signal level at 50 Hz, 100 Hz, 150 Hz and higher harmonics so as to minimize the interfering field.

If the test room is comprised from several shields enclosingly superposed one another, it is also possible to provide the inner walls of the intermediate enclosures with coils for measuring the magnetic field. In many cases it is not necessary to install new coils inasmuch the room walls anyhow are provided with coils used for demagnetization. However, the inner shields are ill suited for active shielding, because the induced voltage is of the same order of magnitude as the thermal noise voltage of the antenna.

A practicable feedback arrangement is difficult to implement. This is because the test room in practice tends to be nonsymmetrical and a transfer function between the current applied to the compensation coils and the voltage induced in the coils of the enclosure exhibits a slow response and a complicated nature. For optimized control, the magnetic field induced in the innermost space of the test room by the externally acting magnetic field should be measured using a SQUID magnetometer, and the thus obtained information should then be used for optimizing the operation of the compensating controller.

The arrangement according to the invention may also be used in such shielded rooms that are provided with only a single wall of ferromagnetic material. Herein, the term ferromagnetic material refers to any material of a high relative permeability. Such materials among others are iron and mu-metal. Typically these materials offer a relative permeability of about 100 to 30,000.

According to an embodiment of the invention, the magnetic field is measured by inductive means from the exterior or interior shielding walls of the test room and this information is used for controlling, typically via a feedback arrangement, coils located outside the room. However, the response of the room is slow, which means that when the current through the coils is changed, it takes several milliseconds before the thus induced magnetic field has penetrated through the walls into the interior of the test room. In the transfer function of system, this retarded response is not simply that caused by one or two poles of the function, but rather is similar to that caused by a delay circuit. In terms of control technology, this means that the interference field imposed on the test room walls cannot be compensated for by feedback means even if the control signal amplitude could basically be made sufficiently high for the compensation. The problem can be solved by complementing the system with a feedforward control. Hence, in a preferred embodiment of the invention, the magnitude of the residual field (substantially at the "higher" frequencies of about 1 Hz to 100 Hz) is measured to detect those components that have not been able to be eliminated by the feedback control applied in the above-described manner to the different coils (x, y and z) of the room and, based on the measurement, a predictive estimate is computed on the field to be in the interior of the room after a short period of time. More specifically, the predictive estimate of the x-direction component of the magnetic field at a point x, y, z of the test room is computed from equation $Bx(x,yz,t)=a(xyz,0)Bx(t)\cdot a(xyz,dt)Bx(t-dt)+a(xyz,2dt)Bx(t-2dt) \ldots b(xyz.dt)By(d-dt) \ldots c(xyz,dt)Bz(t-dt) \ldots$ . In order to solve the coefficients $a(xyz,dt)$, $a(xyz,2dt)$, $a(xyz,3dt) \ldots b(xyz,dt) \ldots$ the magnetic field at the walls must first be measured and the correlation function of the measurement results must be computed at different points in the interior of the test room. Obviously, this mode of the field behavior needs to be computed only for those points of the test room where the sensors of a biomagnetic imaging apparatus, typically a brain imaging apparatus, will be situated. In practice it can be assumed that the correlation functions must be computed for all directions of the field at the imaging center of the brain imaging apparatus, however, so that the model can predict values for all the components of the magnetic field and its gradients. Another technique is to estimate the magnetic fields at six points (or in practice, at seven points) for each one of the three axes of the room space, whereby the number of variables to be processed for the predictive estimate is 18 (or 21, respectively). If the system is assembled in its minimum configuration, all the coils of the test room are used and the signals obtained therefrom are combined so that estimates Bx, By and Bz are obtained for the homogeneous field components in the room. These results are then used in a normal manner for minimizing the residual field by feedback control. The measurement signals of the residual field components are sampled, e.g. at 1 ms intervals and the thus obtained matrix of measurement values is used up to, e.g., a period of 1 s for predicting the magnitude of the magnetic field in all directions, e.g. at six (or seven) points of the test room. This information is submitted, e.g., to the computer of the brain imaging apparatus that utilizes the field information when processing the imaging data. Another alternative arrangement is to place coils in the interior of the test room that then compensate for the residual field on the basis of the computed predictive estimate thereof. While the former signal-processing technique probably gives a more accurate end result, the latter has the benefit that it facilitates the use of component constructions delivered by different manufacturers for both the shielded room and the magnetometer.

In practice the temporal dependence of the residual field can be formulated "mathematically", thus permitting a substantial reduction in the computation task.

The "predictive" estimation of the residual field may also be carried out using recursive methods. Using an efficient algorithm, a conventional PC may accomplish the task effortlessly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for attenuating a magnetic interference in a test room equipped with a shield of ferromagnetic material, the method including the steps of:

measuring an interfering magnetic field; and generating a compensating field on a basis of a measurement result, wherein the interfering field to be measured is resolved in three magnetic field components oriented in different directions, each one of said three magnetic field components is measured by measurement coils wound about individual wall elements of the test room, the wall elements being made from said ferromagnetic material such that a flux component passing through at least one of the wall elements made from said ferromagnetic material that is oriented parallel to one of said magnetic field components is measured with the help of said coils wound about said at least one of the wall elements.

2. The method according to claim 1, wherein each one of the wall elements has two of said coils at the ends of one of said wall elements for the measurement of one component of the magnetic field.

3. The method according to claim 2, wherein two of said coils are connected in series in order to maximize a detected signal.

4. The method according to claim 2, wherein two of said coils are connected to separate circuits in order to detect a field gradient.

5. The method according to claim 1, wherein one of the magnetic field components is measured with the help of a tubular structure formed by four of said wall elements whose axis is oriented parallel to the magnetic field component being measured, whereby each one of the wall elements is equipped with at least one of said measurement coils.

6. The method according to claim 1, wherein a compensation coil is wound around outer sides of the wall elements of the test room.

7. The method according to claim 1, wherein an apparatus is used comprising feedback means for adjusting a magnitude and a phase shift of a feedback signal to one or more compensation coils wound around a perimeter of the test room on a basis of a measurement signal obtained from at least one of the measurement coils.

8. The method according to claim 1, wherein the interfering magnetic field is measured with the help of a Superconducting Quantum Interference Device (SQUID) magnetometer.

9. The method according to claim 1, wherein the processing of a feedback signal takes into account the dependence of the induced voltage on the time derivative of the imposed magnetic field.

10. The method according to claim 1, wherein a residual magnetic field in the test room is measured, and; based thereon, a forecast estimate is computed on a magnetic field estimated to be in an interior of the test room after a short period of time.

11. The method according to claim 1, wherein a correlation function of the measurement result is computed for all directions of the magnetic field at a center point of a measured test room volume, so that a model used in the computation gives a forecast estimate for both the interfering magnetic field and its gradients in all of the computed directions.

12. The method according to claim 1, wherein all the measurement coils of the test room are utilized by way of combining signals obtained therefrom so as to get estimates Bx, By, and Bz for homogenous field components in the test room, whereupon the estimates are used for minimizing a residual magnetic field in the test room by way of a feedback arrangement.

* * * * *